United States Patent [19]

Kazawa et al.

[11] Patent Number: 5,237,590
[45] Date of Patent: Aug. 17, 1993

[54] TIMING EXTRACTION CIRCUIT AND COMMUNICATION SYSTEM UTILIZING THE SAME

[75] Inventors: Tohru Kazawa, Kokubunji; Toshiro Suzuki, Tama; Takashi Morita; Souichi Yamashima, both of Yokohama, all of Japan

[73] Assignees: Hitachi, Ltd., Tokyo; Hitachi Communication Systems, Inc., Yokohama, both of Japan

[21] Appl. No.: 804,925

[22] Filed: Dec. 11, 1991

Related U.S. Application Data

[63] Continuation-in-part of Ser. No. 492,059, Mar. 12, 1990, Pat. No. 5,123,030.

[30] Foreign Application Priority Data

Dec. 25, 1990 [JP] Japan .................................. 2-405638

[51] Int. Cl.$^5$ .............................................. H04L 25/49
[52] U.S. Cl. ...................................... 375/20; 375/119; 370/105.5; 371/5.4
[58] Field of Search ................. 375/13, 17, 20, 111, 375/114, 116, 119, 120; 320/105.5; 307/271, 354, 362; 371/5.4

[56] References Cited

U.S. PATENT DOCUMENTS

| | | | |
|---|---|---|---|
| 4,339,823 | 7/1982 | Predina et al. | 375/20 |
| 4,651,026 | 3/1987 | Serfaty et al. | 375/20 |
| 4,775,989 | 10/1988 | Takatori et al. | 375/20 |
| 4,888,790 | 12/1989 | Wong et al. | 375/20 |
| 5,123,030 | 6/1992 | Kazawa et al. | 375/20 |

OTHER PUBLICATIONS

IEEE NTC 1980, 65.4, "Manchester Coding With Predistortion: An Efficient and Simple Transmission Technique in Local Digital Ring Networks", Meyr et al. Communication Systems CS81-187, Institute of Electronics, Information and Communication Engineers in Japan.

*Primary Examiner*—Curtis Kuntz
*Assistant Examiner*—Young Tse
*Attorney, Agent, or Firm*—Fay, Sharpe, Beall, Fagan, Minnich & McKee

[57] ABSTRACT

A timing clock extraction circuit for extracting from a multilevel code signal, transmitted at a predetermined baud rate, in which cross timings with a reference level are generated at frequency timings several times the baud rate, a clock pulse train at the baud rate and obtaining discriminative data from the multilevel code signal in accordance with the extracted clock pulse train. The timing clock extraction circuit includes a detector for detecting cross timings between the multilevel code signal and a predetermined threshold value; a synchronization control circuit for outputting a clock pulse train having a frequency several times said baud rate in synchronism with the cross timings; a clock generator for dividing the several-time clock pulses to generate a plurality of trains of baud rate clock pulses in different phase from each other; and a decision unit for distinguishing a baud rate clock pulse train from the plurality of trains of baud rate clock pulses which are synchronized with discriminative points of the multilevel code signal by using the cross timings and the clock pulse train having a frequency several times the baud rate.

12 Claims, 7 Drawing Sheets

TIMING EXTRACTION CIRCUIT AND COMMUNICATION SYSTEM UTILIZING THE SAME

CROSS-REFERENCE TO RELATED APPLICATION

This is a continuation-in-part of our U.S. Ser. No. 492,059, filed Mar. 12, 1990, now U.S. Pat. No. 5,123,030, the disclosure of which is hereby incorporated by reference.

BACKGROUND OF THE INVENTION

The present invention relates to a timing extraction circuit and a digital communication system, and more particularly, to such a timing extraction circuit and a communication system suitable for use in performing high-speed transmission of above several megabits per second between an exchanger and a terminal through a telephone line as a transmission medium.

In a digital communication system, received data is acquired by discriminating a received waveform in synchronism with a certain reference clock pulse train. For this purpose, a technique of generating the reference clock pulses from a received waveform, that is, a method of extracting a timing signal, plays an important role. In a high speed digital transmission system for transmitting data at a speed above several megabits per second through a telephone line, since signal losses are increased due to the telephone line, and cross-talk noises are also increased, it is desirable to employ a multilevel transmission code having a narrow frequency band. As a transmission code satisfying this condition, a method of employing an LC tank circuit has conventionally been known. In order to extract the necessary clock pulses with, for example, the partial response class-4 (hereinbelow simply referred to as PR4 code), the received signal is raised to the fourth power, and the biquadrate is applied to the LC tank circuit.

On the other hand, regarding low speed digital transmission, there has been also known a method of converting a received waveform to a digital signal by an A/D converter, which are subjected to correlative operations so a to extract the timings.

Also, as a method applicable to a high speed transmission realized by relatively simple hardware, a zero-cross detecting method has been known. Detail of the zero-cross method is disclosed, for example, in IEEE, NTC 1980 65.4, wherein a timings of zero-cross points are detected by a discriminator having a threshold value set at 0 volt, and these signals are inputted to a phase locked loop (PLL) to extract the timing clock pulses. This method is extensively applied to two-level code signal data transmission.

There is also known a method of using a PLL after full-wave rectification it for applying to the three-level AMI code. Such a method is disclosed, for example, in Communication systems CS81-187, Institute of Electronics, Information and Communication Engineers in Japan.

SUMMARY OF THE INVENTION

Among the above-mentioned prior arts, the method of employing an LC tank, since employing a coil (L), presents a difficulty in integrated circuit implementation. Also, dispersions in the values of coil and capacitor elements largely influence the characteristics, which results in requiring a fine adjustment by a human. Especially, for the PR4 code which requires a double square circuit, the circuit configuration becomes extremely complicated.

A method of performing correlation operations using an A/D convertor, in turn, is not appropriate to extract a timing from a transmitted code at a speed in the order of Mbit/sec since there exists no A/D convertor applicable to such a high transmission speed.

Further, the zero-cross method, since it is intended to process two-level code signals, cannot extract an exact timing from a multilevel code signal such as the PR4 code. The reason of such failure is described in detail in U.S. Pat. No. 5,123,030.

Also, the method of employing a full-wave rectification circuit and a PLL inherently implies degradation in accuracy due to a nonlinear processing or full-wave rectification, whereby a sufficient accuracy cannot be obtained on the practical level.

As a method of solving the above-mentioned problems of the prior art, U.S. Pat. No. 5,123,030 describes a timing extraction method suitable to the PR4 code. This method extracts a clock double a baud rate by detecting zero-cross points of a received waveform, then divides this extracted clock to generate two kinds of baud rate clocks, and discriminates the baud rate clocks coincident with discriminative points of the received waveform. As an discrimination means, there are shown a method of discriminating a received waveform respectively with the two baud rate clocks and regarding, as a correct clock, one which can read a frame synchronization pattern, a method of regarding, as a correct clock, one which does not violate coding rules, and so on.

However, in U.S. Pat. No. 5,123,030, the method of reading a frame synchronization pattern must use the result of frame synchronization for establishing bit synchronization. Generally, a frame synchronization processing is performed after a bit synchronization processing has been completed, whereby the two processings are made highly independent of each other to thereby readily implement the processings with individual LSIs. With this respect, the above-mentioned method is not so desirable since the two processings are inseparable.

The method of detecting coding rule violations, in turn, has a problem of taking too much time to reliably ensure to detect violations. There are six violation patterns: (1, 1, 1); (−1, −1, −1); (1, −1, 1); (−1, 1, −1); (1, 0, 1); and (−1, 0, −1). According to our experiments, a mean time slot length necessary to detect a violation is about 25. Supposing that 100 violations are to be detected to prevent malfunctions due to noises, 2500 time slots are at least required.

It is an object of the present invention to provide a timing extraction system in which bit synchronization and frame synchronization are completely separated.

It is another object of the present invention to provide a timing extraction system which is capable of definitely distinguishing clock pulses coincident with discriminative points for a short time.

To solve the above-mentioned problems, the present invention pays attention to the frequency of generation of zero-cross points in a received waveform. The frequency of generation of zero-crosses points which coincide with the discriminative points is larger than that of zero-cross points located at intermediate points between discriminative points, and its ratio is approximately 2:1. Therefore, a number of zero-cross points are counted using each of two kinds of clocks extracted by the above-mentioned prior art, and the one presenting a larger number of counts is distinguished as the clock that coincides with the discriminative point.

However, when a particular pattern such as that exclusively including "1" is sequentially present, this method implies a problem that generated zero-cross points are all located at intermediate points between the discriminative points. Although such a sequence of a particular pattern can be reduced in a lower possibility by using a scrambler, it is not sufficient to ensure a high stability.

Another method of solving this problem is to count a number of cross points of a received waveform and a data discriminative threshold value, not a number of zero-cross points. As long as the received waveform is correctly shaped, the received waveform will never cross the data discriminative threshold value at discriminative points. It is therefore possible for any transmitted pattern to rapidly determine which of two kinds of clocks extracted by the foregoing prior art coincides with the discriminative points.

When attention is paid to the frequency of generation of zero-cross points in a received waveform, the frequency of generation of zero-cross points 112 matching the discriminative point is larger than the frequency of generation of zero-cross points 111 located in the middle of the discriminative points, as shown in FIG. 3, and the ratio is substantially 2:1. This is because the zero-cross points coincident with the discriminative points are generated in the transition of (1, 0), (−1, 0), (0, 1) and (0, −1), while the latter zero-cross points are only generated in the transition of (1, −1) and (−1, 1). Therefore, numbers of zero-cross points are counted respectively using the two kinds of clocks extracted by the foregoing prior art, and the one providing a larger number of counts is distinguished as the clock that coincides with the discriminative points. Since a mean time slot number necessary to count 100 zero-cross points is about 200, the determination can be made for a shorter time than any of the prior art methods.

When a number of cross points between a received waveform and data discriminative threshold value is to be counted, the received waveform will never cross the data threshold value at discriminative points as long as the received waveform is correctly shaped, as shown in FIG. 5. It is therefore possible to rapidly determined which of the two kinds of clocks extracted by the foregoing prior art coincides with the discriminative points for any transmission pattern.

The foregoing and other objects, advantages, manner of operation and novel features of the present invention will be understood from the following detailed description when read in connection with the accompanying drawings.

DESCRIPTION OF THE PREFERRED EMBODIMENTS

Figure 1:
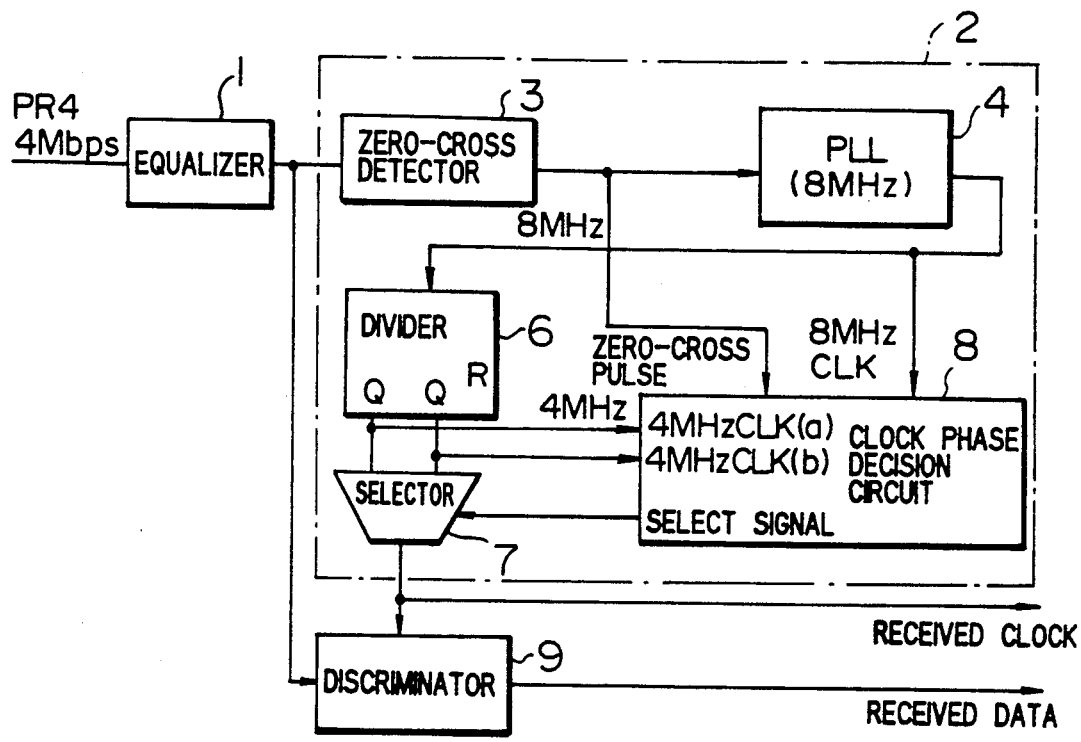
FIG. 1 is a block diagram illustrating a first embodiment of the present invention for counting zero-cross pulses.

FIG. 1 illustrates a first embodiment of the present invention which is applied to a 4 mbps PR4 transmission circuit. A received waveform has its distortion caused by transmission shaped by an equalizer 1. A timing extraction circuit 2 is composed of a zero-cross detector 3, a PLL 4, a divider 6, a selector 7 and a clock phase decision circuit 8. A zero-cross pulse detected by the zero-cross detector 3 is inputted to the PLL 4 which is tuned at a frequency double the baud rate, i.e., 8MHz to output a clock at 8MHz. The divider 6 divides the 8-MHz clock generated by the PLL 4 to generate two kinds of 4-MHz clock pulse trains respectively having a different phase from each other. The two kinds of 4-MHz clock pulse trains are inputted to the clock phase decision unit 8 together with the zero-cross pulses to output a select signal. Clock pulses coincident with discriminative points are determined in accordance with the select signal. Then, in accordance with the outputted received clock, a discriminator 9 discriminates data from the output waveform shaped by the equalizer 1.

Figure 2:
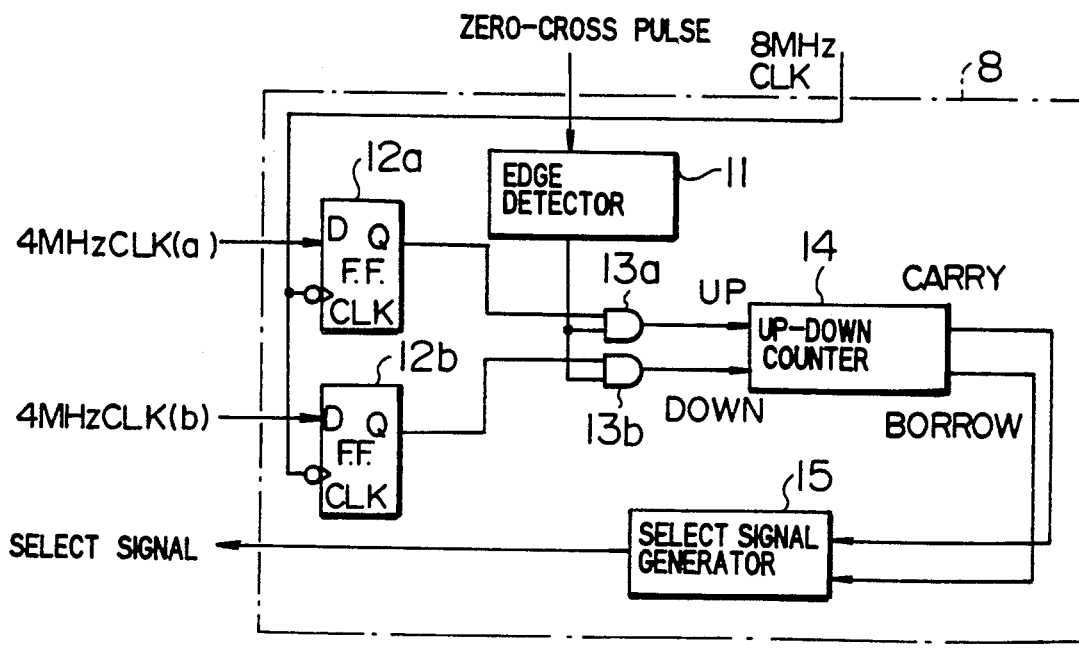
FIG. 2 is a schematic circuit diagram illustrating a detailed embodiment of a clock phase decision circuit.
Figure 3:
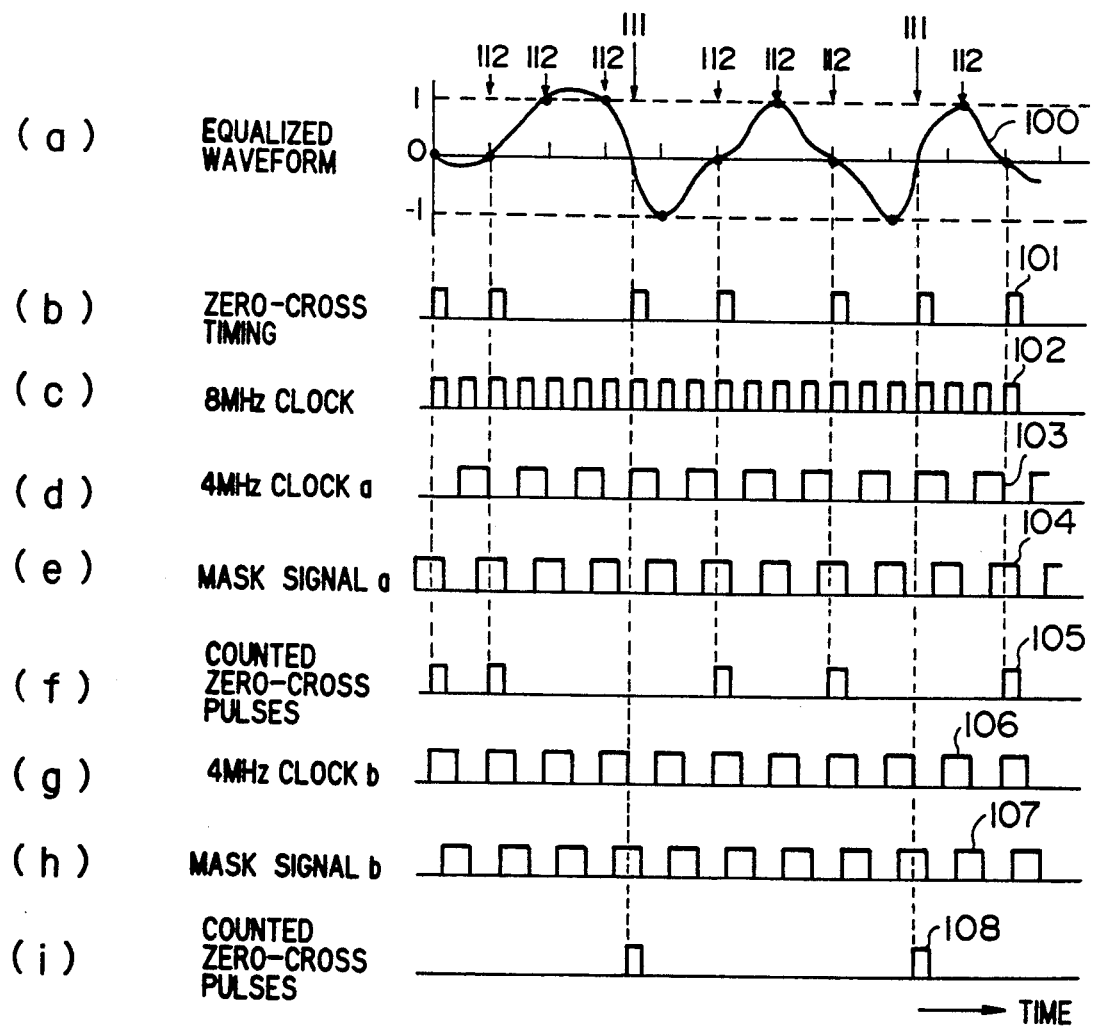
FIG. 3 is a timing chart illustrating the operation of the first embodiment.

Next, the operation of the clock phase decision circuit 8 will be explained with reference to FIGS. 2 and 3. FIG. 2 illustrates the configuration of the clock phase decision circuit, and FIG. 3 is a timing chart showing the operation of the first embodiment. The zero-cross pulses cause an edge detector 11 to extract leading timings (a signal 101 shown in (b) of FIG. 3). Mask signals a and b (signals 104 and 107 in (e) and (h) of FIG. 3) are generated respectively by flip-flops 12a and 12b from 4-MHz clock pulse trains a and b (signals 103 and 106 in (d) and (g) of FIG. 3) at respective trailing edges of an 8-MHz clock 102. It cannot be previously known from which of the flips flops 12a and 12b the respective mask signals 104 and 107 are outputted, however, it is supposed in this embodiment that the mask signal 104 is outputted from the flip-flop 12a, while the mask signal 107 is outputted from the flip-flop 12b. Each of the mask signals 104 and 107 of (e) and (h) of FIG. 3 and the zero-cross pulses 101 of (b) of FIG. 3 are ANDed by AND gates 13a and 13b, respectively, to generate two kinds of zero-cross pulse trains 105 and 108 shown in (f) and (i) of FIG. 3. The zero-cross pulses 105 and 108 are counted by an up-down counter 14. A carry signal is generated if the number of the zero-cross pulses 105 is larger than that of the zero-cross pulses 108, and otherwise a borrow signal is generated, after a time corresponding to the number of stages provided in the up-down counter 14. Under the above-mentioned assumption, the ratio of generation frequencies of the zero-cross pulses 105 and 108 are substantially 2 to 1, whereby it is understood that the zero-cross pulses 105, which have been generated more than the zero-cross pulses 108, belongs to a clock that coincides with the discriminative point. It is ensured at this point that trailing edges of the 4-MHz clock 103 coincide with the discriminative points of the equalized waveform 100. A selector controller 15 has the selector 7 generate a control signal so as to select the clock 103.

Figure 4:
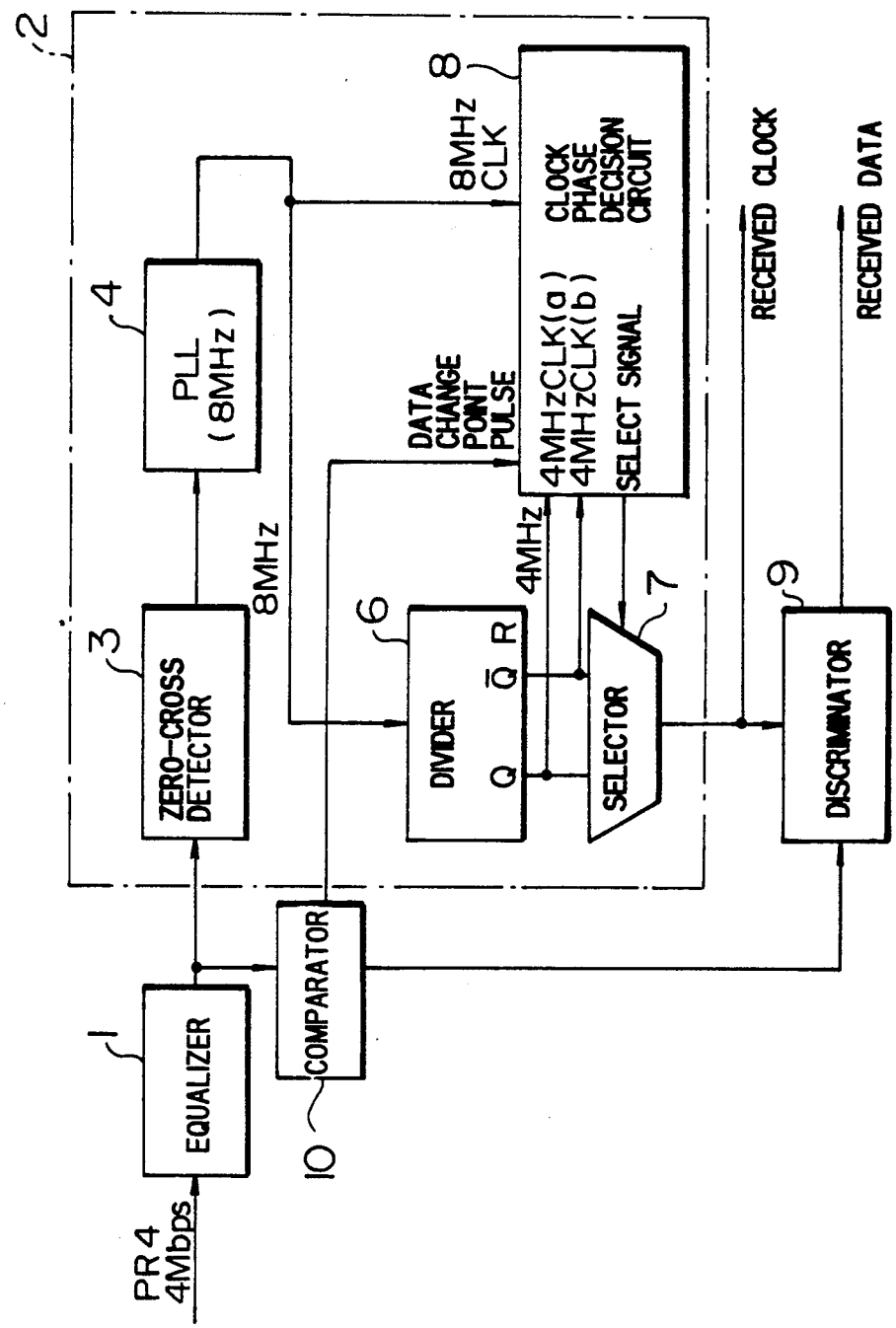
FIG. 4 is a block diagram illustrating a second embodiment of the present invention for counting data change point pulses.

Next, a second embodiment of the present invention likewise applied to a 4-Mbps PR4 transceiver will be described with reference to FIG. 4 illustrating a block diagram thereof. A received waveform is fed to an equalizer 1 for shaping distortions caused by transmission. A timing extraction circuit 2 is composed of a zero-cross detector 3, a PLL 4, a divider 6, a selector 7 and a clock phase decision circuit 8. A zero-cross pulses detected by the zero-cross detector 3 are inputted to the PLL 4 which is tuned at a frequency double the baud rate, i.e., 8MHz to output a clock at 8MHz. The divider 6 divides the 8-MHz clock generated by the PLL 4 to generate two kinds of 4-MHz clock pulse trains respectively having a different phase from each other. The above operation is the same as that of the previously explained first embodiment. The second embodiment differs from the first embodiment in that inputs to the clock phase decision circuit 8 are two 4-MHz clock pulse trains and cross points (hereinbelow referred to as the data change point) between a data threshold value and the received waveform which is outputted from a comparator 10. The selector 7 distinguishes clock pulses coincident with the discriminative points in accordance with a select signal outputted from the clock phase decision circuit 8. A discriminator 9 discriminates data from the output waveform of the comparator 10. As an alternative configuration of a distinguishes 5, the divider 6 and the selector 7 may be integrated such that a select signal is inputted to a reset terminal of the divider 6, and only one output of the divider 6 rises or falls in response to the input timing of the select signal.

Figure 5:
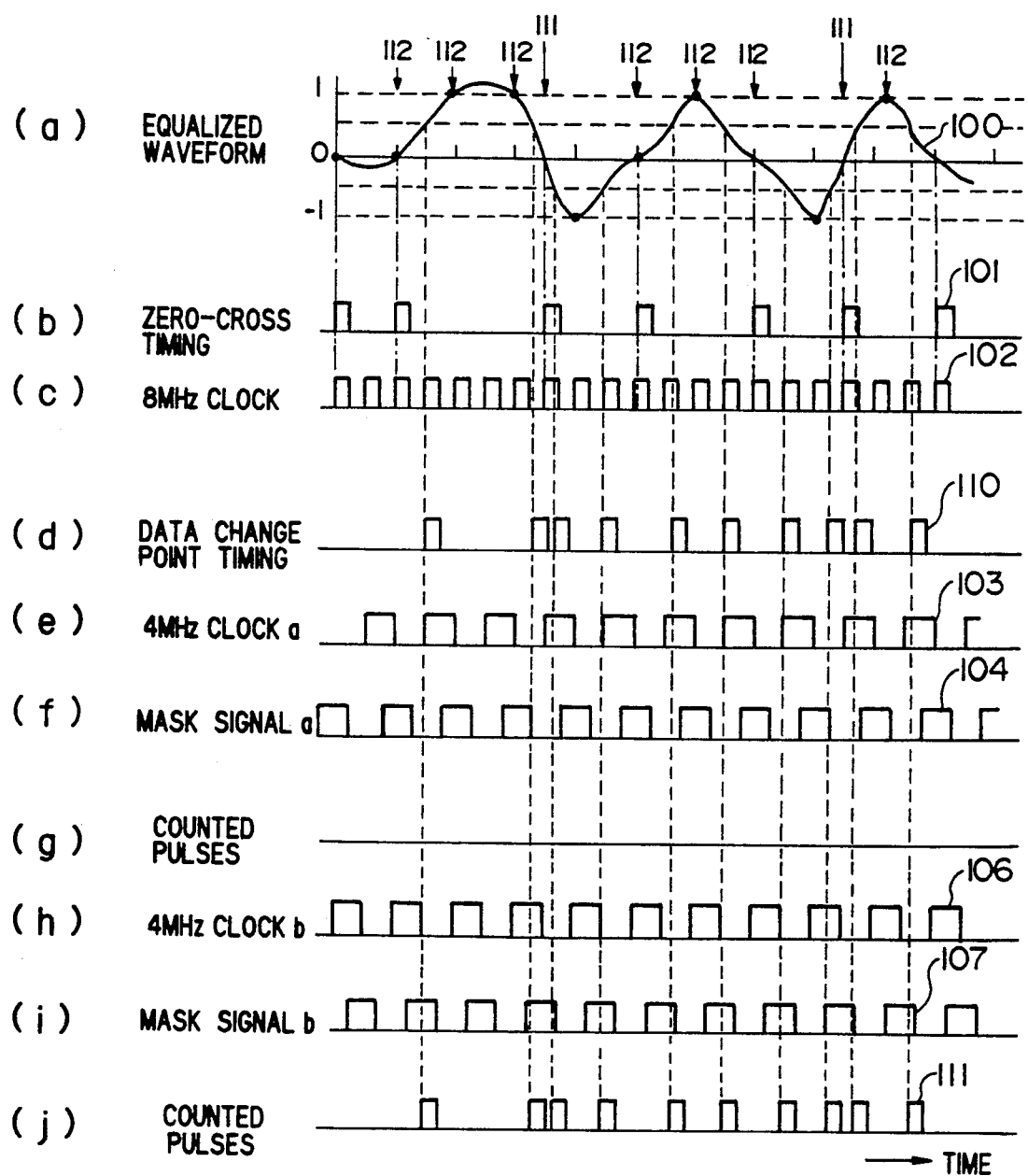
FIG. 5 is a timing chart illustrating the operation of the second embodiment.

The operation of the clock phase decision circuit 8 in the second embodiment will be describe with reference to FIGS. 2 and 5. FIG. 2 illustrates an example of the configuration of the clock phase decision circuit 8, and FIG. 5 is a timing chart showing the operation of the second embodiment. Different from the first embodiment, the data change point signal is inputted in place of the zero-cross signal to cause an edge detector 11 to extract a leading timings (a signal 110 shown in (d) of FIG. 5). Mask signals a and b (signals 104 and 107 in (f) and (i) of FIG. 5) are generated respectively by flip-flops 12a and 12b from the 4-MHz clock pulse trains a and b (signals 103 and 106 in (e) and (h) of FIG. 5) at respective trailing edges of the 8-MHz clock pulse train 102. It is supposed that the mask signal 104 is outputted from the flip-flop 12a, while the mask signal 107 is outputted from the flip-flop 12b. Each of the mask signals 104 and 107 of (f) and (i) of FIG. 5. and the data change point pulses 110 of (d) of FIG. 5 are ANDed to only detect a data change point pulse train 111 of (j) of FIG. 5 generated from the 4-MHz clock pulse train 103. It is therefore ensured to output a carry signal after a fixed time. At this point, trailing edges of the 4-MHz clock pulse train 103 precisely coincide with the discriminative points of the equalized waveform 100. A selector controller 15 controls the selector 7 to generate a control signal so as to select the clock pulse train 103.

In the above-mentioned first and second embodiments, the pulse duty of the mask signals is determined to be 50%. Reduction of the pulse duty, though causing a bit more complicated circuit configuration, may prevent the counter 14 from counting at erroneous timings which may be caused by deviated positions of the count pulses due to waveform distortion.

Figure 6:
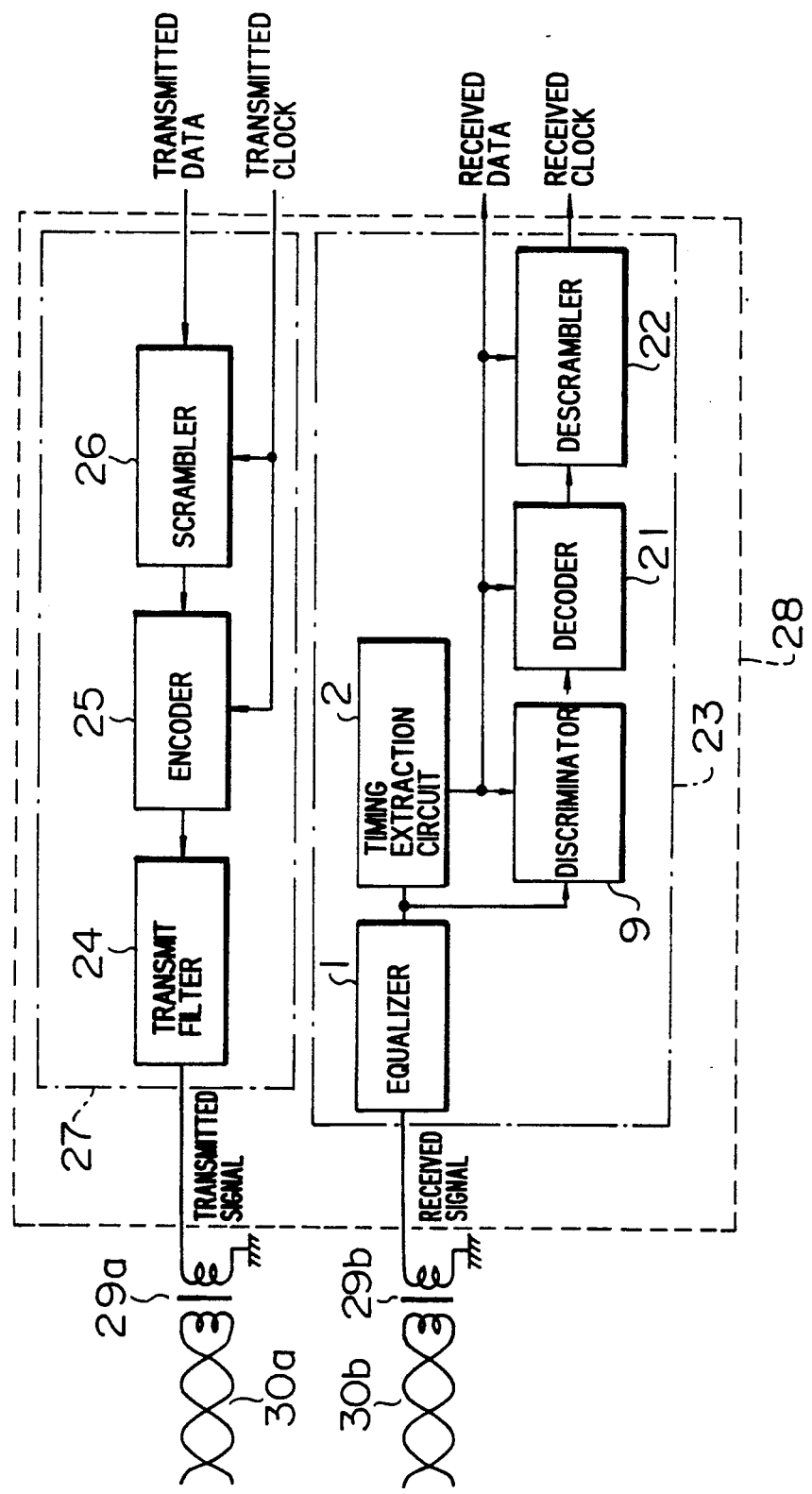
FIG. 6 is a block diagram illustrating an embodiment of the present invention which is applied to a digital transmission circuit.

FIG. 6 illustrates an embodiment of a digital transceiver to which the present invention is applied. A receiver 23 is composed of a decoder 21 and a descrambler 22, in addition to the timing extraction circuit 2, the equalizer 1 and the discriminator 9, as previously explained. A transmitter 27 is composed of a scrambler 26 for preventing sequential transmission of a particular pattern, an encoder 25 for performing transmission encoding such as PR4, and a transmit filter 24 for preventing generation of unnecessary high frequency components. The transmitter 27 and the receiver 28 are connected through a transformer 29 and a telephone line 30.

Figure 7:
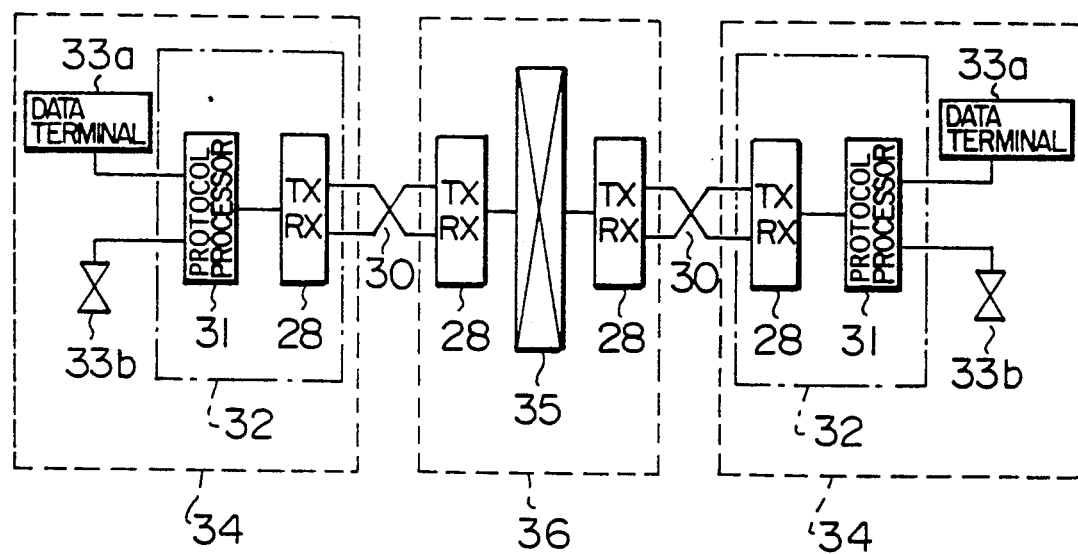
FIG. 7 is a block diagram illustrating an embodiment of the present invention which is applied to a communication system.

FIG. 7 illustrates an embodiment of a communication system in which the above described transceiver 28 is employed. An exchanger 36 and audio/data integration terminals 34 are connected through a telephone line 30. The exchanger 36 comprises an exchange circuit 35 and the same number of transceivers as that of terminals 34. The transceiver 28 in the terminal 34 is arranged to connect the receiver to a transmitter of the transceiver in the exchanger 36. A communication interface is composed of the transmitter 28 and a protocol processor 31 in the terminal 34, and the audio/data integration terminal 34 includes a data terminal 33a and a telephone 33b connected thereto.

Figure 8:
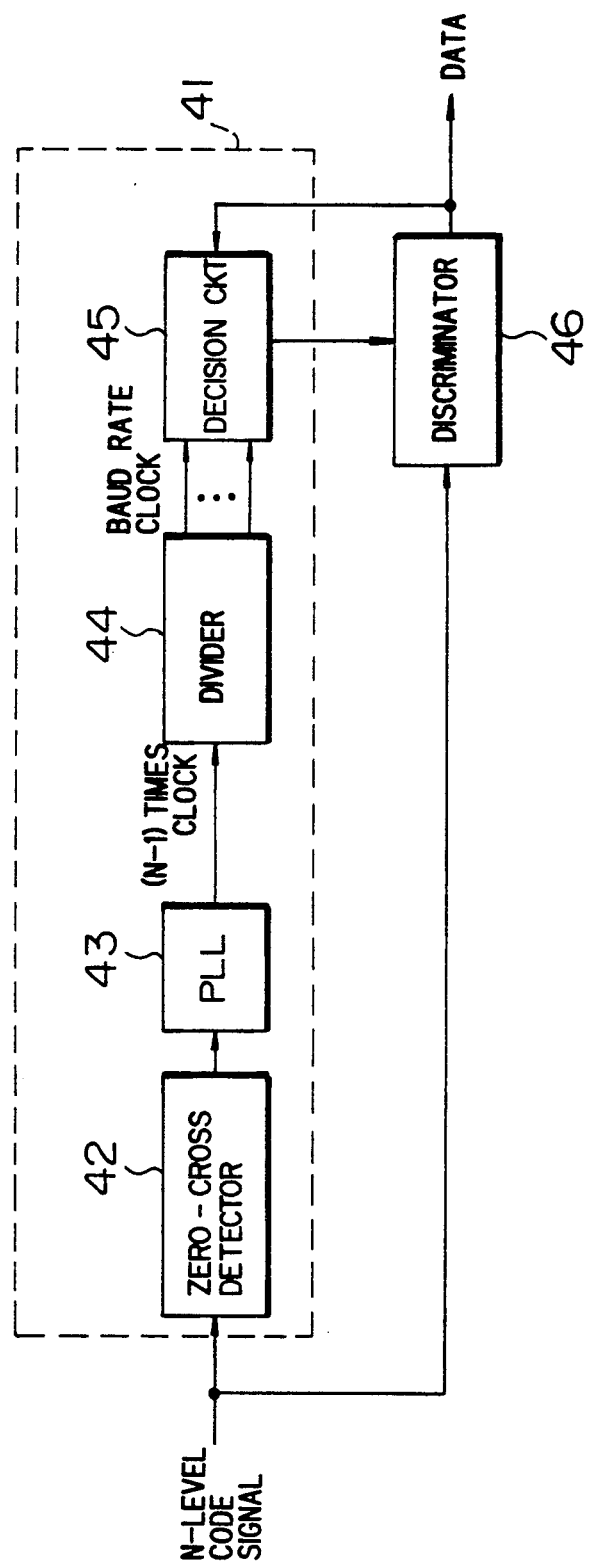
FIG. 8 is a block diagram illustrating a concept of an earlier application U.S. Pat. No. 5,123,030.

FIG. 8 illustrates a concept of a part of technologies disclosed in U.S. Pat. No. 5,123,030. From an inputted N-level code signal, a timing extraction circuit 41 extracts a clock pulse train at a frequency N−1 times a baud rate of the inputted N-level code signal using a zero-cross detector 42, and a PLL 43 tuned at a frequency N−1 times the baud rate. After N−1 kinds of baud rate clock pulse trains are obtained by a divider 44, one train of baud rate clock pulses coincident with discriminative points is distinguished by a decision circuit 45. Since the decision is made by using an output of a discriminator 46, a zero-cross count, as achieved by the present invention, was not carried out. The present invention employs a signal immediately before inputted to the discriminator 46 and an output of the zero-cross detector 42.

In the present invention, since bit synchronization and frame synchronization are completely separated, the two processings can be readily performed by separate LSIs. Also, decision of clock pulses coincident on the discriminative points can be clearly made in a short time.

We claim:
1. A timing clock extraction circuit for extracting from a multilevel code signal, transmitted at a predetermined baud rate, in which cross timings with a reference level are generated at frequency timings several times said baud rate, a clock pulse train at said baud rate and obtaining discriminative data from said multilevel code signal in accordance with said extracted clock pulse train, comprising:
    a detector for detecting cross timings between said multilevel code signal and a predetermined threshold value;
    a synchronization control circuit for outputting a clock pulse train having a frequency several times said baud rate in synchronism with said cross timings;
    a clock generator for dividing said several-time clock pulses to generate a plurality of trains of baud rate clock pulses in different phase from each other; and decision means for distinguishing a baud rate clock pulse train from said plurality of trains of baud rate clock pulses which are synchronized with discriminative points of said multilevel code signal by using said cross timings and said clock pulse train having a frequency several times said baud rate.

2. A timing extraction circuit according to claim 1, wherein said decision circuit counts the number of said cross timings by using said respective baud rate clock pulse trains, compares the numbers of said cross timings obtained by said respective baud rate clock pulse trains with one another, and distinguishes from this comparison result a train of baud rate clock pulses which are synchronized with the discriminative points of said multilevel code signal.

3. A timing clock extraction circuit for extracting from a multilevel code signal, transmitted at a predetermined baud rate, in which cross timings with a reference level are generated at frequency timings several times said baud rate, a clock pulse train at said baud rate and obtaining discriminative data from said multilevel code signal in accordance with said extracted clock pulse train, comprising:
- a detector for detecting cross timings between said multilevel code signal and a predetermined first threshold value;
- a synchronization control circuit for outputting a clock pulse train having a rate several times said baud rate in synchronism with said cross timings;
- a clock generator for dividing said severaltime clock pulse train to generate a plurality of trains of baud rate clock pulses having different phases from each other;
- a comparator for comparing said multilevel code signal with a second threshold value; and
- decision means for distinguishing a baud rate clock pulse train from said plurality of trains of baud rate clock pulses which are synchronized with discriminative points of said multilevel code signal by using an output signal of said comparator and said clock pulse train having a frequency several times said baud rate.

4. A timing extraction circuit according to claim 3, wherein said decision circuit counts the number of said cross timings by using said respective baud rate clock pulse trains, compares the numbers of said cross timings obtained by said respective baud rate clock pulse trains with one another, and distinguishes from this comparison result a train of baud rate clock pulses which are synchronized with the discriminative points of said multilevel code signal.

5. A communication system having a transmitter and receiver connected with each other through a communication line, wherein said transmitter transmits data at a predetermined baud rate as a multilevel code signal in which cross timings with a reference level are generated at a frequency timing several times said baud rate, and said receiver extracts a clock pulse train at said baud rate from said multilevel code signal and derives a discriminative data from said multilevel code signal in accordance with said clock pulse train, said communication system comprising:
- a detector for detecting cross timings between said multlevel code signal and a predetermined threshold value;
- a synchronization control circuit for outputting a clock pulse train having a frequency several times said baud rate in synchronism with said cross timings;
- a clock generator for dividing said severaltime clock pulses to generate a plurality of trains of baud rate clock pulses in different phase from each other; and
- decision means for distinguishing a baud rate clock pulse train from said plurality of trains of baud rate clock pulses which are synchronized with discriminative points of said multilevel code signal by using said cross timings and said clock pulse train having a frequency several times said baud rate.

6. A communication system according to claim 5, wherein said decision circuit counts the number of said cross timings by using said respective baud rate clock pulse trains, compares the numbers of said cross timings obtained by said respective baud rate clock pulse trains with one another, and distinguishes from this comparison result a train of baud rate clock pulses which are synchronized with the discriminative points of said multilevel code signal.

7. A communication system having a transmitter and receiver connected with each other through a communication line, wherein said transmitter transmits data at a predetermined baud rate as a multilevel code signal in which cross timings with a reference level are generated at a frequency timing several times said baud rate, and said receiver extracts a clock pulse train at said baud rate from said multilevel code signal and derives a discriminative data from said multilevel code signal in accordance with said clock pulse train, said communication system comprising:
- a detector for detecting cross timings between said multilevel code signal and a predetermined first threshold value;
- a synchronization control circuit for outputting a clock pulse train having a rate several times said baud rate in synchronism with said cross timings;
- a clock generator for dividing said several-time clock pulse train to generate a plurality of trains of baud rate clock pulses having different phases from each other;
- a comparator for comparing said multilevel code signal with a second threshold value; and
- decision means for distinguishing a baud rate clock pulse train from said plurality of trains of baud rate clock pulses which are synchronized with discriminative points of said multilevel code signal by using an output signal of said comparator and said clock pulse train having a frequency several times said baud rate.

8. A communication system according to claim 7, wherein said decision circuit counts the number of said cross timings by using said respective baud rate clock pulse trains, compares the numbers of said cross timings obtained by said respective baud rate clock pulse trains with one another, and distinguishes from this comparison result a train of baud rate clock pulses which are synchronized with the discriminative points of said multilevel code signal.

9. A timing extraction method for extracting, from a multilevel code signal having a predetermined baud rate, in which cross timings with a reference level is generated at a frequency timing several times said baud rate, a clock pulse train at said baud rate, and extracting a timing for obtaining discriminative data from said multilevel code signal in accordance with said clock pulse train, said method comprising the steps of:

detecting cross timings between said multilevel code signal and a predetermined threshold value;

generating a clock pulse train having a frequency several times said baud rate in synchronism with said cross timings;

dividing said clock pulse train at the rate several times said baud rate to generate a plurality of trains of baud rate clock pulses respectively having different phases from one another; and distinguishing a baud rate clock train from said plurality of trains of baud rate clock pulses which are synchronized with discriminative points of said multilevel code signal by using said cross timings and said clock pulse train having a frequency several times said baud rate.

10. A timing extraction circuit according to claim 9, wherein said distinguishing step counts the number of said cross timings by using said respective baud rate clock pulse trains, compares the numbers of said cross timings obtained by said respective baud rate clock pulse trains with one another, and distinguishes from this comparison results a baud rate clock pulse train which is synchronized with the discriminative points of said multilevel code signal.

11. A timing extraction method for extracting, from a multilevel code signal having a predetermined baud rate in which cross timings with a reference level is generated at a frequency timing several times said baud rate, a clock pulse train at said baud rate, and extracting a timing for obtaining discriminative data from said multilevel code signal in accordance with said clock pulse train, said method comprising the steps of:

detecting cross timings between said multilevel code signal and a predetermined first threshold value;

generating a clock pulse train having a rate several times said baud rate in synchronism with said cross timings;

dividing said several-time clock pulse train to generate a plurality of trains of baud rate clock pulses having different phases from each other;

comparing said multilevel code signal with a second threshold value; and distinguishing one of said plurality of trains of baud rate clock pulses which are synchronized with discriminative points of said multilevel code signal by using an output signal of said comparator and said clock pulse train having a frequency several times said baud rate.

12. A timing extraction method according to claim 11, wherein said distinguishing step counts the number of pulses generated from the results of said comparison between said multilevel code signal and said second threshold value by using said respective baud rate clock pulse trains, compares the numbers of the pulses obtained by said respective baud rate clock pulse trains, and distinguishes from this comparison result a train of baud rate clock pulses which are in synchronism with the discriminative points of said multilevel code signal.

* * * * *